United States Patent
Chan et al.

(10) Patent No.: US 7,259,049 B2
(45) Date of Patent: Aug. 21, 2007

(54) SELF-ALIGNED ISOLATION DOUBLE-GATE FET

(75) Inventors: Kevin K. Chan, Staten Island, NY (US); Guy M. Cohen, Mohegan Lake, NY (US); Meikei Ieong, Wappingers Falls, NY (US); Ronnen A. Roy, Ossining, NY (US); Paul M Solomon, Yorktown Heights, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 11/146,624

(22) Filed: Jun. 7, 2005

(65) Prior Publication Data

US 2005/0263797 A1      Dec. 1, 2005

Related U.S. Application Data

(62) Division of application No. 10/328,285, filed on Dec. 23, 2002, now Pat. No. 6,946,696.

(51) Int. Cl.
*H01L 21/84* (2006.01)

(52) U.S. Cl. .............................. 438/157; 257/E21.415; 438/164; 438/233

(58) Field of Classification Search ................ 438/157, 438/164, 233; 257/347, E21.415, E29.151, 257/E29.275, 250

See application file for complete search history.

(56) References Cited

U.S. PATENT DOCUMENTS 5,140,391 A      8/1992   Hayashi et al.
5,188,973 A      2/1993   Omura et al.
5,349,228 A      9/1994   Neudeck et al.
5,773,331 A      6/1998   Solomon et al.
6,492,212 B1    12/2002   Ieong et al.
6,580,132 B1     6/2003   Chan et al.
6,919,647 B2 *   7/2005   Hackler et al. ............. 257/250
7,022,562 B2 *   4/2006   Deleonibus ................. 438/197
7,176,481 B2 *   2/2007   Chen et al. ................... 257/19
2006/0110884 A1* 5/2006   Wang et al. ................ 438/270
2006/0151837 A1* 7/2006   Chen et al. ................. 257/369

* cited by examiner

*Primary Examiner*—Michelle Estrada
*Assistant Examiner*—Jarrett J. Stark
(74) *Attorney, Agent, or Firm*—Scully, Scott, Murphy & Presser, P.C.; Ido Tuchman, Esq.

(57) ABSTRACT

A double-gate field effect transistor (DGFET) structure and method of forming such a structure in which the parasitic capacitance under the source/drain regions is substantially reduced are provided. Two new means to reduce the parasitic capacitance under the source/drain regions are provided. Firstly, the silicon area outside the gate is converted to oxide while protecting a silicon ledge adjacent to the gate with a first spacer. The oxidation can be facilitated using a self-aligned oxygen implant, or implant of some other species. Secondly, the first spacer is removed, replaced with a second spacer, and a new silicon source/drain area is grown by employing lateral selective epi overgrowth and using the now exposed silicon ledge as a seed, over the self-aligned oxide isolation region. This achieves a low-capacitance to the back-plane, while retaining control of the threshold voltages.

12 Claims, 8 Drawing Sheets

SELF-ALIGNED ISOLATION DOUBLE-GATE FET

RELATED APPLICATIONS

This application is a divisional of U.S. application Ser. No. 10/328,285, filed Dec. 23, 2002 now U.S. Pat. No. 6,946,696.

FIELD OF THE INVENTION

The present invention relates to double-gate field effect transistors (DGFETs), and in particular to DGFETs that include self-aligned isolation regions and a body ledge that serves as a seed layer for Si growth. The present invention also relates to a method of fabricating DGFETs having the aforementioned features.

BACKGROUND OF THE INVENTION

In order to make integrated circuits (ICs) such as memory, logic and other devices, of higher integration density than currently feasible, one has to find a means to further scale down the FET devices that are present therein. Moreover, as FET dimensions are scaled down, it becomes increasingly difficult to control short-channel effects by conventional means. Short-channel effects, as well known to those skilled in the art, are the decrease in threshold voltage, $V_t$, in short-channel devices, i.e., sub-0.1 micron, due to two-dimensional electrostatic charge sharing between the gate and the source/drain regions.

An evolution beyond the standard single gate metal oxide semiconductor field effect transistor (MOSFET) is the double-gate MOSFET, where the device channel is confined between top and bottom gate dielectric layers. This structure, with a symmetrical gate structure, can be scaled to about half of the channel length as compared to a conventional single gate MOSFET structure. It is well known that a dual gate or double-gate MOSFET device has several advantages over conventional single gate MOSFET devices. Specifically, the advantages for dual gate MOSFET devices over their single gate counterparts include: a higher transconductance, lower parasitic capacitance, and improved short-channel effects. For instance, Monte-Carlo simulation has been previously carried out on a 30 nm channel dual gate MOSFET device and has shown that the dual gate device has a very high transconductance (2300 mS/mm) and fast switching speeds (1.1 ps for nMOSFET).

Moreover, improved short-channel characteristics are obtained down to 20 nm channel length with no doping needed in the channel region. This circumvents the tunneling breakdown, dopant quantization, and dopant depletion problems associated with channel doping that are normally present with single gate MOSFET devices.

Some examples of prior art double-gate MOSFETs are found in the following references:

U.S. Pat. No. 5,188,973 describes a double-gate structure in which the bottom gate is not self-aligned to the top gate. This prior art double-gate structure is quite different from the inventive double-gate structure described herein in that the inventive DGFET includes an oxide isolation region which is self-aligned to the front gate. No such self-aligned oxide isolation region is disclosed in the '973 patent. Moreover, in the present invention the Si body contains ledges adjacent to either side of the front gate. The Si ledges are used in the present invention to selectively grow epi-Si regions, which regions eventually will become the source/drain regions of the inventive DGFET. The '973 patent does not disclose the presence of such ledges therein.

U.S. Pat. No. 5,140,391 describes another double-gate structure. In this prior art double-gate structure, no oxide isolation region that is self-aligned to the front gate is disclosed. Moreover, the '391 patent does not disclose a structure including a Si body that contains ledges adjacent to either side of the front gate, which are used as a seed layer to grow selective epi-Si regions atop the self-aligned isolation regions.

U.S. Pat. No. 5,349,228 describes another double-gate structure in which no oxide isolation region that is self-aligned to the front gate is disclosed. Moreover, the '228 patent does not disclose a structure including a Si body that contains ledges adjacent to either side of the front gate, which are used as a seed layer to grow selective epi-Si regions atop the self-aligned isolation regions.

To date, prior art methods for fabricating double-gate MOSFETs have either been very complex or have severe drawbacks in terms of parameter control. Moreover, some of the structures known in the art have large parasitic capacitance between the back-gate and the source/drain regions. This can be reduced by increasing the back-gate dielectric thickness, but with the penalty of reduction of back-gate control, and poorer scaling properties. The back-gate dielectric should be about 20× thicker than the front gate dielectric for low capacitance, assuming standard layouts, but 2-4× thicker for effective control.

Co-assigned U.S. Pat. No. 5,773,331 describes a structure and method for fabricating a double-gate MOSFET structure in which the above problems have been solved. In particular, the '331 patent describes a double-gate MOSFET having sidewall source and drain contacts and bottom and top gate oxides that are self-aligned. The structure disclosed in the '331 patent has low parasitic capacitance to the bottom gate and a reduced drain and source resistance as compared to other prior art double-gate MOSFETs.

In the '331 patent, the double-gate MOSFET having the above-mentioned characteristics is obtained by the steps of: forming a channel layer; forming a top gate insulator layer on the channel layer; forming a top gate on the top gate insulator; forming a gate pillar on the top gate; forming insulating sidewall layers adjacent to the top gate and the gate pillar; forming an integral source/drain region within the channel layer by introduction of dopants; forming conductive amorphous sidewalls on either side of, and adjacent to the insulating sidewall layers, one of the amorphous silicon sidewalls being connected to the drain region and the other being connected to the source region; and etching the channel layer using the top gate, gate pillar, insulating sidewall layers and amorphous silicon sidewalls as a mask, thereby transferring the lateral extension of the mask into the channel layer, providing for a channel with integral source/drain regions being raised with respect to the support structure.

Despite being capable of providing self-aligned top and bottom gates, the prior art double-gate MOSFET disclosed in the '331 patent does not provide oxide isolation regions that are self-aligned to the front gate. Moreover, the '331 patent does not disclose a structure including a Si body that contains ledges adjacent to either side of the front gate, which are used as a seed layer to grow selective epi-Si regions atop the self-aligned isolation regions. As such, the prior art structure disclosed in the '331 patent does not provide the smallest area for the back-gate. Thus, the prior art double-gate MOSFET does not effectively provide for the smallest possible capacitance.

SUMMARY OF THE INVENTION

The present invention provides a DGFET structure and method of forming such a structure in which the parasitic capacitance under the source/drain regions is substantially reduced. The present invention introduces two new means to reduce the parasitic capacitance under the source/drain regions. Firstly, the silicon area outside the gate is converted to oxide while protecting a silicon ledge adjacent to the gate with a first spacer having a first lateral thickness. The oxidation can be facilitated using a self-aligned oxygen implant, or implant of some other species. Secondly, the first spacer is removed, replaced with a second spacer that has a lateral thickness that is less than the lateral thickness of the first spacer, and a new silicon source/drain area is grown by employing lateral selective epitaxial overgrowth and using the now exposed silicon ledge as a seed, over the self-aligned isolation region. This achieves a low-capacitance to the back-plane, while retaining control of the threshold voltages.

The DGFET of the present invention, which has substantially reduced parasitic capacitance, comprises:

a doped back-plane region having isolation regions located adjacent to portions of said doped back-plane region;

a back-gate dielectric located atop a surface portion of said doped back-plane region not containing said isolation regions;

a Si-containing layer having ledges located atop said back-gate dielectric, each of said ledges including a source/drain extension region;

a front gate dielectric located atop portions of said Si-containing layer;

a front gate located atop said front gate dielectric, said front gate having spacers on sidewalls thereof; and source/drain regions located adjacent to said front gate and over said isolation regions, said source/drain regions being in contact with said source/drain extension regions.

In preferred embodiments of the present invention, the isolation regions are self-aligned with the front gate.

The present invention also provides a method of fabricating the above-mentioned DGFET. Specifically, the method of the present invention comprises the steps of:

providing a structure which includes at least a doped back-plane region, a back-gate dielectric formed atop said doped back-plane region, a Si-containing layer formed atop said back-gate dielectric, a front gate dielectric formed atop said Si-containing layer, and a front gate formed atop said front gate dielectric, said structure having isolation trench regions adjacent to at least said doped back-plane region;

forming first spacers having a first lateral width on exposed sidewalls of said front gate, said first spacers protecting portions of said underlying Si-containing layer from oxidation;

forming isolation regions in regions of said structure which are adjacent to, and overlaying a portion of said doped back-plane region, whereby ledges are formed in said Si-containing layer under said first spacers;

removing said first spacers and replacing the same with second spacers, said second spacers having a lateral width that is less than the first lateral width of said first spacers;

selectively growing Si-containing regions above and in contact with said ledges; and forming source/drain regions in said Si-containing regions.

The term "Si-containing" is used throughout the specification to denote a semiconducting material that includes silicon. Illustrative examples of such Si-containing materials include Si, SiGe, SiC, SiGeC and the like. Preferably, the Si-containing material employed in the present invention is Si.

DETAILED DESCRIPTION OF THE INVENTION

Figure 1:
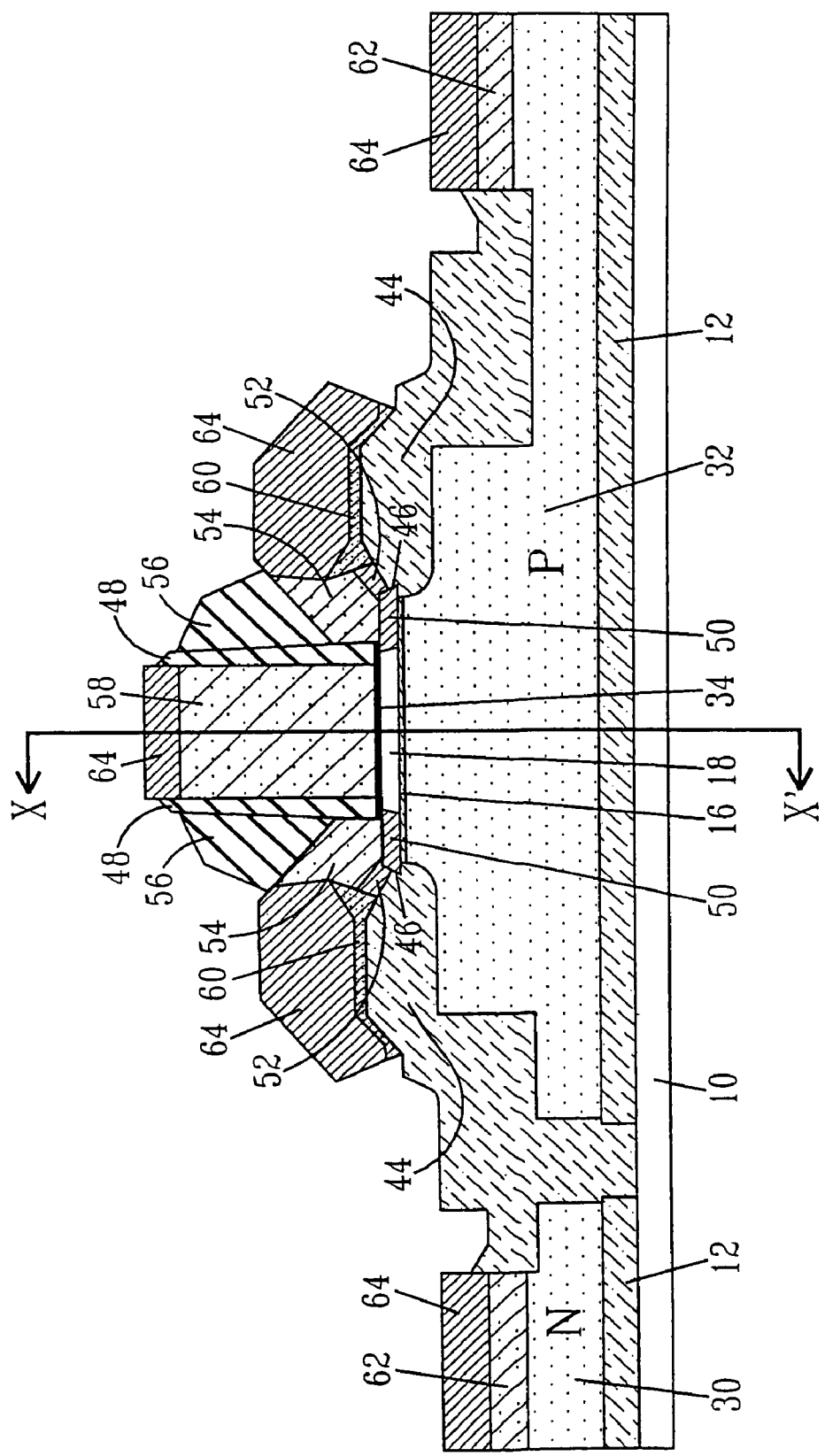
FIG. 1 is a pictorial representation (through a cross-sectional view) illustrating the DGFET structure of the present invention that includes self-aligned isolation regions and Si ledges.

The present invention, which provides self-aligned isolation DGFETs and a method of fabricating the same, will now be described in more detail by referring to the drawings that accompany the present application. It is noted that in the drawings and description that follows an NFET having a P-doped back-plane, including a contact to the back-plane, and an insulated N-doped back-plane contact for PFETs (not shown) is described.

Although such a structure is shown and described, the present invention contemplates a structure having the opposite polarity, i.e., a PFET having an N-doped back-plane, including a contact to the back-plane, and an insulated P-doped back-plane contact for NFETs. The structure having the opposite polarity is fabricated by changing the dopant species described herein below to the opposite polarity.

FIG. 1 illustrates a cross-sectional view of the self-aligned isolation double gate FET of the present invention. Specifically, the self-aligned isolated DGFET of the present invention includes a doped back-plane region 32 having isolation regions 44 located adjacent to portions of the doped back-plane region 32. The structure of the present invention further includes a back-gate dielectric 16 located atop a surface portion of the doped back-plane region 32 and a Si-containing layer 18 (which is the thin body region of the DGFET of the present invention) having ledges 46 located atop the back-gate dielectric 16. As shown, each of the ledges 46 includes source/drain extension region 50. The DGFET of the present invention also includes front gate dielectric 34 located atop portions of the Si-containing layer 18 and a front gate 58 located atop the front gate dielectric 34. Insulating spacers (referred to herein below as the second spacers) 48 are positioned on sidewalls of the front gate 58 as well as surface portions of the Si-containing layer 18.

Source/drain regions 60 are located adjacent to the front gate 58 and over the isolation regions 44. As illustrated, the source/drain regions 60 are in contact with the source/drain extension regions 50 and the isolation regions 44 are typically self-aligned with the front gate 58.

The DGFET structure of the present invention also includes a doped back-plane region 30 which includes a contact region 62 that has a region of silicide 64 located thereon. Silicides 64 are also present atop the front gate 58 and the source/drain regions 60.

Figure 2A:
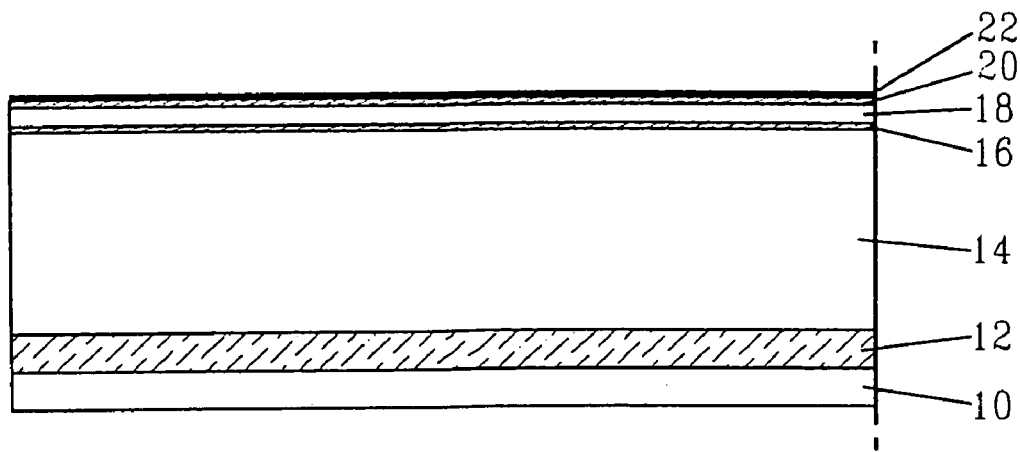
FIGS. 2A-2N are pictorial representations (through cross-sectional views) illustrating the basic processing steps used in fabricating the DGFET shown in FIG. 1.

The other components shown and labeled in FIG. 1, not specifically mentioned herein above, will be described in greater detail in FIGS. 2A-2N. FIGS. 2A-2N are representative of the structure shown to the left of plane X-X'.

The method of forming the self-aligned isolated DGFET shown in FIG. 1 will now be described in more detail by referring to FIGS. 2A-2N. Reference is first made to FIG. 2A which illustrates a cross-sectional view of an initial stack structure that can be employed in the present invention. Specifically, the initial stack structure shown in FIG. 2A includes a handle wafer 10, a bottom insulator 12 located atop the handle wafer 10, a polysilicon back-plane region 14 located atop the bottom insulator 12, a back-gate dielectric 16 located atop the polysilicon back-plane region 14, a Si-containing layer 18 located atop the back-gate dielectric 16, a pad oxide 20 located atop the Si-containing layer 18, and a polish stop layer 22 located atop the pad oxide 20.

The structure illustrated in FIG. 2A may be fabricated, in some embodiments, by first providing a transfer wafer (not shown) which includes Si-containing layer 18 formed on a surface of the transfer wafer. The transfer wafer used at this point of the present invention may be a bulk Si wafer or any other type of semiconductor wafer including silicon-on-insulators may be employed. The Si-containing layer 18 may include any of the above mentioned silicon materials, with preference given to Si. When Si is employed as the Si-containing layer 18, the Si may be amorphous, single crystal or polycrystalline, with preference given to single crystal Si since such a material provides high performance devices. In some embodiments, the Si-containing layer 18 is part of the transfer wafer; either an SOI layer for an SOI transfer wafer, where the buried oixde is used as the etch stop, or just the top layer of a bulk silicon wafer.

The Si-containing layer 18 may, in some embodiments, be formed by a conventional deposition process including, for example, chemical vapor deposition (CVD), plasma-assisted CVD, evaporation or chemical solution deposition. The Si-containing layer 18 may have any thickness when it is first applied to the transfer wafer. Typically, the Si-containing layer 18 has an initial thickness of from about 50 to about 200 nm, which may be thinned after performing a subsequent bonding process.

The back-gate dielectric 16 is then formed atop the Si-containing layer 18 by utilizing a conventional deposition process or, alternatively, the back-gate dielectric 16 may be formed by a thermal growing process. The back-gate dielectric 16 may be composed of an oxide, nitride or oxynitride, with preference given to oxide dielectrics. Suitable examples of oxides that can be employed as the back-gate dielectric 16 include, but are not limited to: $SiO_2$, $Al_2O_3$, $ZrO_2$, $HfO_2$, $Ta_2O_3$, $TiO_2$, perovskite-type oxides and combinations and multilayers thereof. The thickness of the back-gate dielectric 16 may vary, but typically, the back-gate dielectric 16 has a thickness of from about 2 to about 20 nm.

The polysilicon back-plane region 14 is then formed atop the back-gate dielectric 16 utilizing a conventional deposition process such as CVD. The polysilicon back-plane 14 region has a thickness of from about 50 to about 500 nm. Next, the bottom insulator 12 is formed atop the polysilicon back-plane 14 utilizing a conventional deposition process or a conventional thermal growing process. The bottom insulator 12 may be an oxide, nitride or oxynitride, with preference given to oxides such as $SiO_2$. The thickness of the bottom insulator 12 may vary, and it not critical to the present invention.

After the transfer wafer containing layers 18, 16, 14, and 12 is provided, the exposed surface of the bottom insulator 12 is bonded to handle wafer 10 using a conventional bonding process that is well known to those skilled in the art. After bonding, the transfer wafer is removed from the bonded structure leaving the Si-containing layer 18 exposed. Specifically, the transfer wafer may be removed by grinding and etching. During the grinding and etching process, the Si-containing layer 18 may be thinned to a thickness of less than 20 nm. A portion of this thinned Si-containing layer 18 is used in the present invention as the body region of the DGFET.

After the removal of the transfer wafer and thinning of the Si-containing layer 18, the pad oxide 20 is formed atop the thinned Si-containing layer 18 by utilizing a conventional deposition process or by utilizing a conventional thermal oxidation process. Notwithstanding which technique is employed, the pad oxide 20 typically has a thickness of from about 2 to about 10 nm, with a thickness of from about 3 to about 5 nm being more highly preferred.

The polish stop layer 22, which may be composed of a nitride and/or oxynitride, is then formed atop the pad oxide 20 utilizing a conventional deposition process well known to those skilled in the art. The thickness of the polish stop layer 22 may vary and is of no significant importance to the present invention.

The above description provides one means for providing the initial structure shown in FIG. 2A. Other means are also contemplated herein. Also, in some embodiments, it is possible to provide an initial structure which does not include the bottom insulator 12. Moreover, in some embodiments, it is possible that the polysilicon back plane region 14 may be part of the handle wafer 10, in which case it would be formed from single crystal Si rather than polycrystalline Si.

Figure 2B:
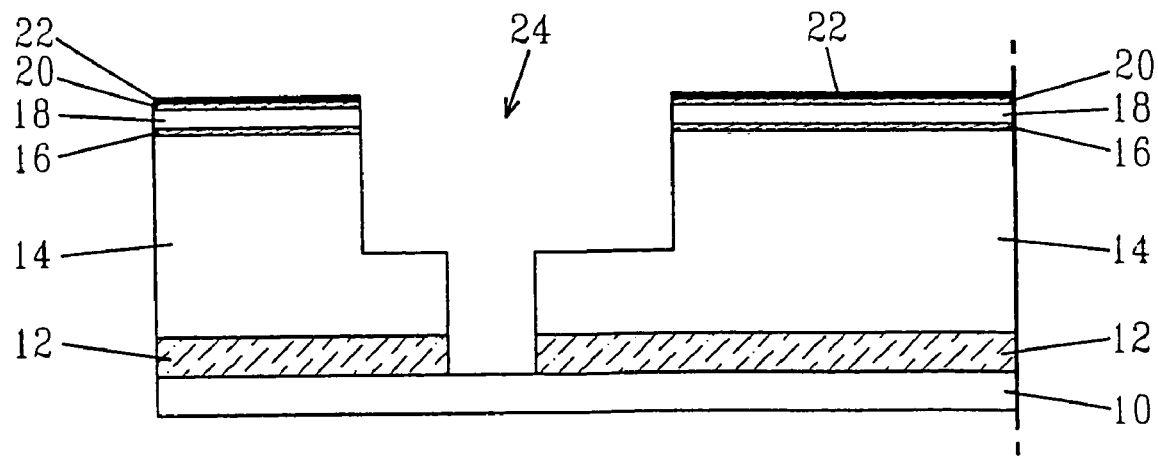

After forming the initial structure shown in FIG. 2A, isolation trench opening 24 having a wide upper region (i.e., shallow trench opening) and a narrow lower region (i.e., deep trench opening) is formed into the initial structure providing the structure shown, for example, in FIG. 2B. At least one other like isolation trench opening 24 would be formed in the structure to the right of that which is shown. The isolation trench opening 24 is formed as follows: First, a conventional photoresist (not shown) is applied to the surface of the polish stop layer 22 utilizing a deposition process such as CVD and spin-coating. The photoresist is then patterned by conventional lithography (including exposure and development) to contain a pattern for fabricating the shallow trench opening. With the patterned photoresist in place, an etching process such as reactive-ion etching (RIE), ion beam etching, or plasma etching is employed to transfer the shallow trench pattern into the initial structure shown in FIG. 2A. During this etching process, exposed portions of the polish stop layer 22, the pad oxide 20, the Si-containing layer 18, and the back-gate dielectric 16 are removed stopping within the polysilicon back-plane region 14.

Following the etching step, the patterned photoresist is removed utilizing a conventional stripping process, and a second photoresist (not shown) is applied and patterned by lithography to include a deep trench pattern. The deep trench pattern is then transferred into the previously etched structure by etching through exposed portions of the polysilicon back-plane region 14 and the bottom insulator 12 stopping atop an upper surface of the handle wafer 10. Following the transfer of the deep trench pattern into the structure, the second photoresist is removed utilizing a conventional stripping process.

Figure 2C:
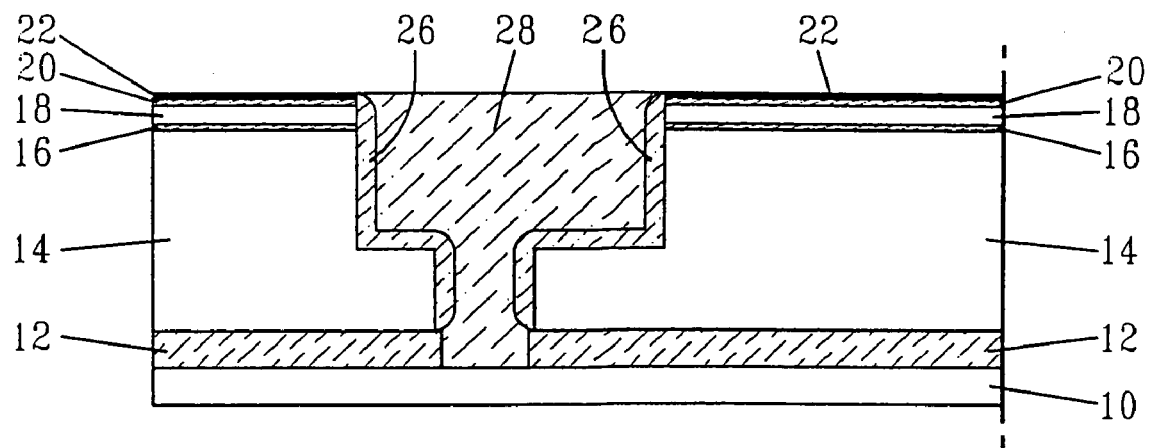

After forming the isolation trench opening 24 into the structure, a trench oxide liner 26 is formed via a thermal oxidation process so as to cover at least the exposed sidewalls of the Si-containing layer 18 and the polysilicon back-plane region 14. The isolation trench opening 24 containing the trench oxide liner 26 is then filled with a dielectric trench material 28 such as a CVD oxide or tetraethylorthosilicate (TEOS) and planarized to the polish stop layer 22 providing the planar structure shown, for example, in FIG. 2C. The isolation trench region including the trench fill material 28 and the trench oxide liner 26 shown in FIG. 2C separates the polysilicon back-plane region 14 into two distinct regions. A second isolation trench region, not shown, would be located on the right hand side of the drawing.

A first implantation mask (not shown) is then formed on portions of the structure, and thereafter ions of a first conductivity type, e.g., N or P, are ion implanted into the polysilicon back-plane region 14 of the structure which does not include the first implantation mask. The first implantation mask is removed and a second implantation mask covering at least the previously ion implanted region is then formed. After forming the second implantation mask, ions of a second conductivity type, e.g., N or P, which differ from the first conductivity type are ion implanted into the polysilicon back-plane region 14 not containing the second implantation mask. The dosage of the ions used during these implantations may vary and may be optimized depending on the type of device being formed. After the second ion implantation process, the second ion implantation mask is removed and then the structure is subjected to an annealing process which is performed utilizing conditions that activate and drive the dopant ions upward through each of the polysilicon back-plane regions 14 until the region is uniformly doped. In the present invention, this annealing is typically performed in an inert gas ambient at a temperature of about 950° C. or greater for a time period of from about 30 minutes or less.

Figure 2D:
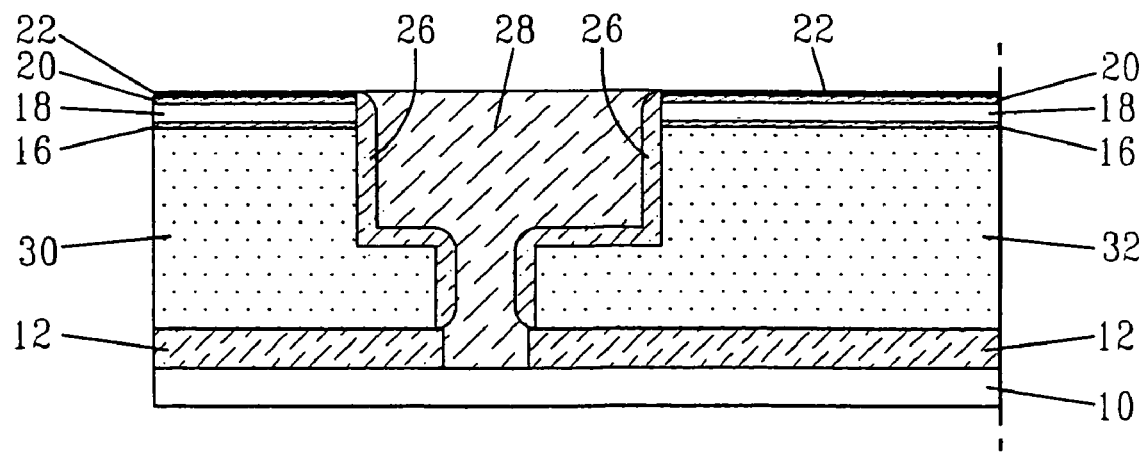
Figure 2E:
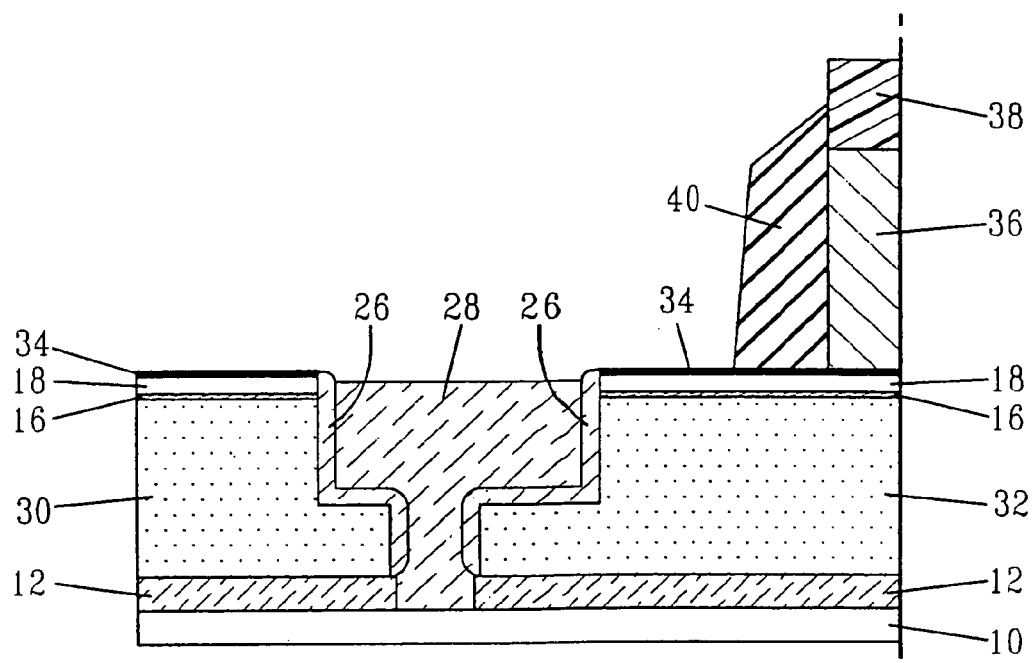

FIG. 2D illustrates the structure that is formed after the various implants and annealing process mentioned above have been performed. In the drawing, reference numeral 30 denotes an N-doped polysilicon back-plane region, whereas reference numeral 32 denotes the P-doped polysilicon back-plane region. The dopant concentration of regions 30 and 32 may vary, but typically the N-doped back-plane region 30 has a dopant concentration of about $1E19$ atoms/cm$^3$ or greater, with a dopant concentration of about $5E19$ atoms/cm$^3$ being more highly preferred. In the case of the P-doped back-plane region 32, that region typically has a dopant concentration of from $1E19$ atoms/cm$^3$ or greater, with a dopant concentration of about $5E19$ atoms/cm$^3$ being more highly preferred. Some of the doped back-plane regions serve as the bottom gate electrode, i.e., the back-gate, of the DGFET of the present invention.

After forming the doped back-plane regions, the polish stop layer 22 is removed from the structure utilizing an etching process that is selective in removing the polish stop 22 material as compared to oxide. This etching step of the present invention removes the polish stop 22 layer from the structure and exposes the underlying pad oxide 20. For example, phosphoric acid can be used in selectively removing the polish stop layer 22 from the structure. After the polish stop layer 22 has been removed from the structure, the exposed pad oxide layer, i.e., layer 20, is selectively removed so as to expose Si-containing layer 18. Any conventional etching process that is selective in removing oxide as compared to Si can be employed. For example, dilute hydrofluoric acid can be used in selectively removing the pad oxide 20 from the structure.

After the pad oxide 20 has been selectively removed, a front (or top) gate dielectric 34 is formed atop the exposed surfaces of the Si-containing layer 18. Front gate dielectric 34 may be composed of the same or different dielectric material as the back-gate dielectric 16. Moreover, the front gate dielectric 34 may be formed utilizing any conventional deposition process such as CVD. The thickness of the front gate dielectric 34 may vary, but typically the front gate dielectric 34 has a thickness of from about 1 to about 3 nm.

A gate electrode material such as polysilicon, a conductive metal, a silicide, or any combination thereof, including multilayers is formed atop the structure utilizing a conventional deposition process and then a mask material such as an oxide or nitride or oxynitride is formed via a conventional deposition process atop the gate electrode material. The preferred material for the gate electrode is polysilicon.

The mask and the gate electrode material are then patterned providing a patterned gate electrode 36 and a patterned mask 38 atop a portion of the front gate dielectric 34 that lies atop the P-doped back-plane region 32. The patterning is achieved utilizing a patterned resist mask (not shown) and etching.

First spacers 40 having a first lateral width are formed on the exposed sidewalls of at least the patterned gate electrode material 36 and a portion of the patterned mask 38. The first spacers 40 are composed of an insulating material such as silicon nitride which can also serve as an oxidation mask. The first spacers 40 are formed by deposition of an insulating material and etching. The first spacers 40 typically have a lateral thickness of from about 20 to about 200 nm. The lateral thickness of spacers 40 must be sufficiently thick to prevent subsequent undergrowth of oxide beneath the patterned gate electrode 36. The structure that is formed after the above steps have been performed is shown, for example, in FIG. 2E.

Figure 2F:
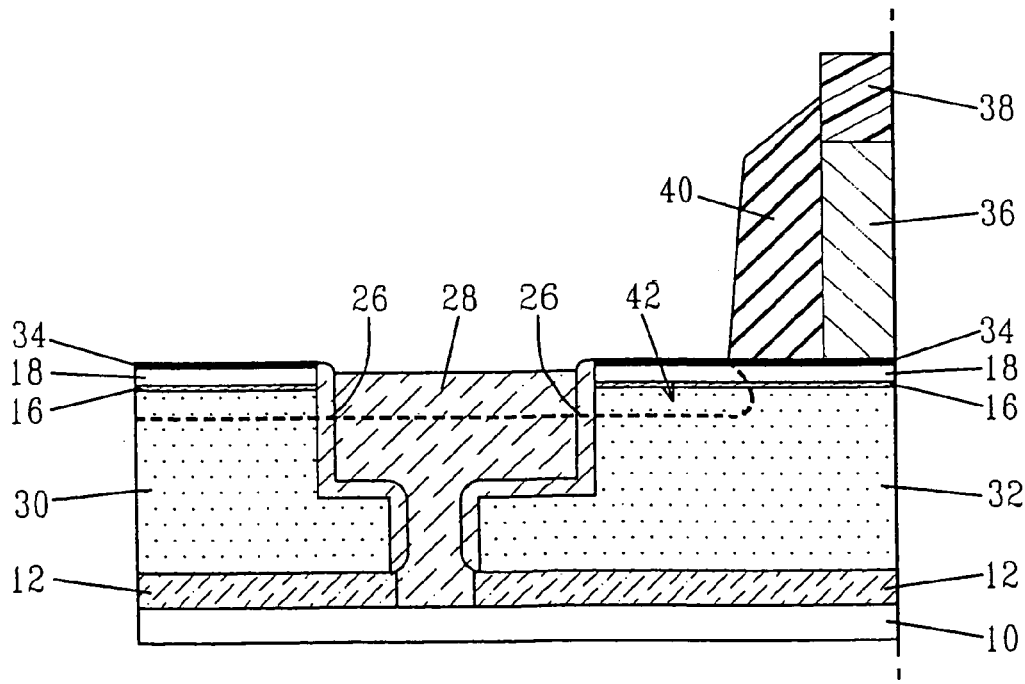

FIG. 2F shows an optional embodiment of the present invention wherein an oxygen seed region 42 may be formed into the structure. The optional oxygen seed region 42 may be formed by implanting oxygen or another suitable oxidation enhancer into the structure, such that the oxygen seed region is self-aligned to the first spacers 40. The optional oxygen seed region 42 is used in the present invention to enhance the subsequent growth of the isolation region 44 into the structure in a self-aligned fashion.

Figure 2G:
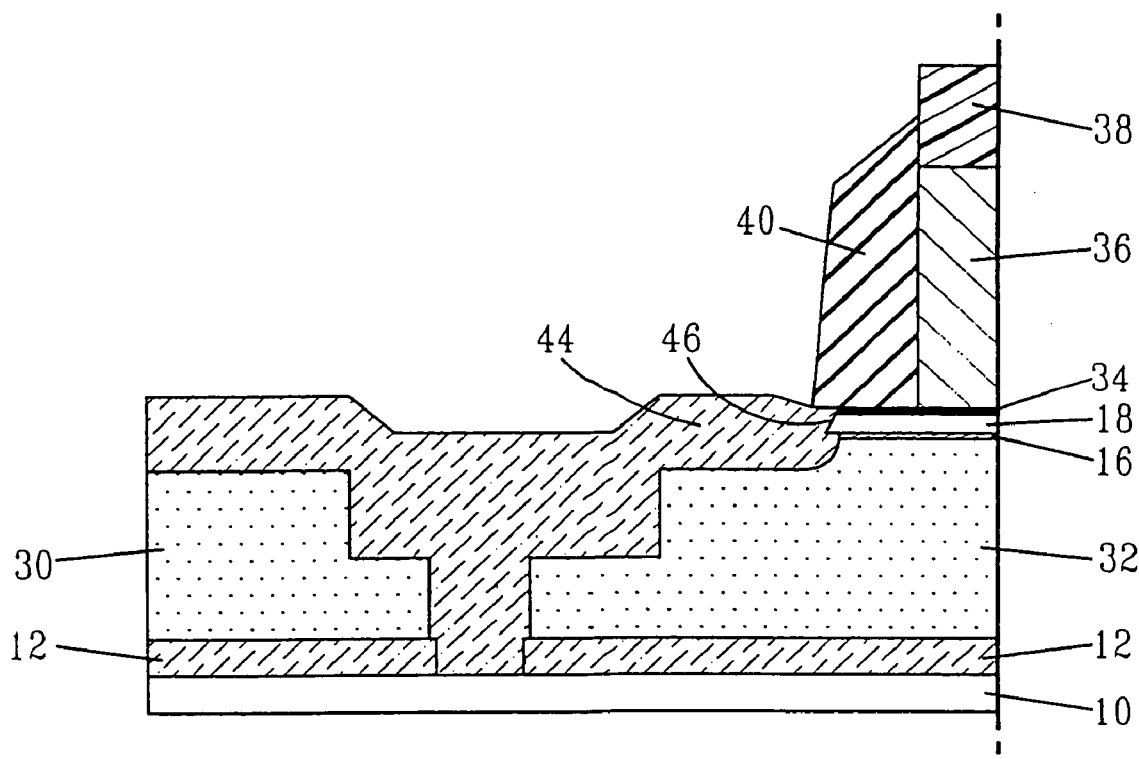

FIG. 2G shows the structure that is formed after subjecting the structure shown in FIG. 2E, or optionally 2F, to a thermal oxidation process. As shown, the resultant structure following the thermal oxidation process contains self-aligned isolation regions 44. Following thermal oxidation, a ledge 46 is formed into the Si-containing layer 18. The ledge 46 of the Si-containing layer 18 extends beyond the outer vertical edge of the patterned gate electrode, yet the ledge 46 does not extend beyond the outer edge of first spacers 40. An equivalent ledge 46 and self-aligned isolation region 44 would be formed to the right of the drawing shown.

After formation of the self-aligned isolation region 44, the first spacers 40 are removed from the structure utilizing a selective etching process and second spacers 48 are formed in the regions previously accompanied by the first spacers 40. The second spacers 48, which are formed by deposition and etching, may be composed of the same or different insulating material as the first spacers 40. The second spacers 48 typically have a lateral thickness which is less than the lateral thickness of the first spacers 40. More specifically, the second spacers 48 have a lateral thickness of from about 10 to about 30 nm, with a lateral thickness of from about 15 to about 25 nm being more highly preferred.

The second spacers 48 are formed over inner portions of the ledge 46; the outer portion of the ledge 46 is left exposed.

Figure 2H:
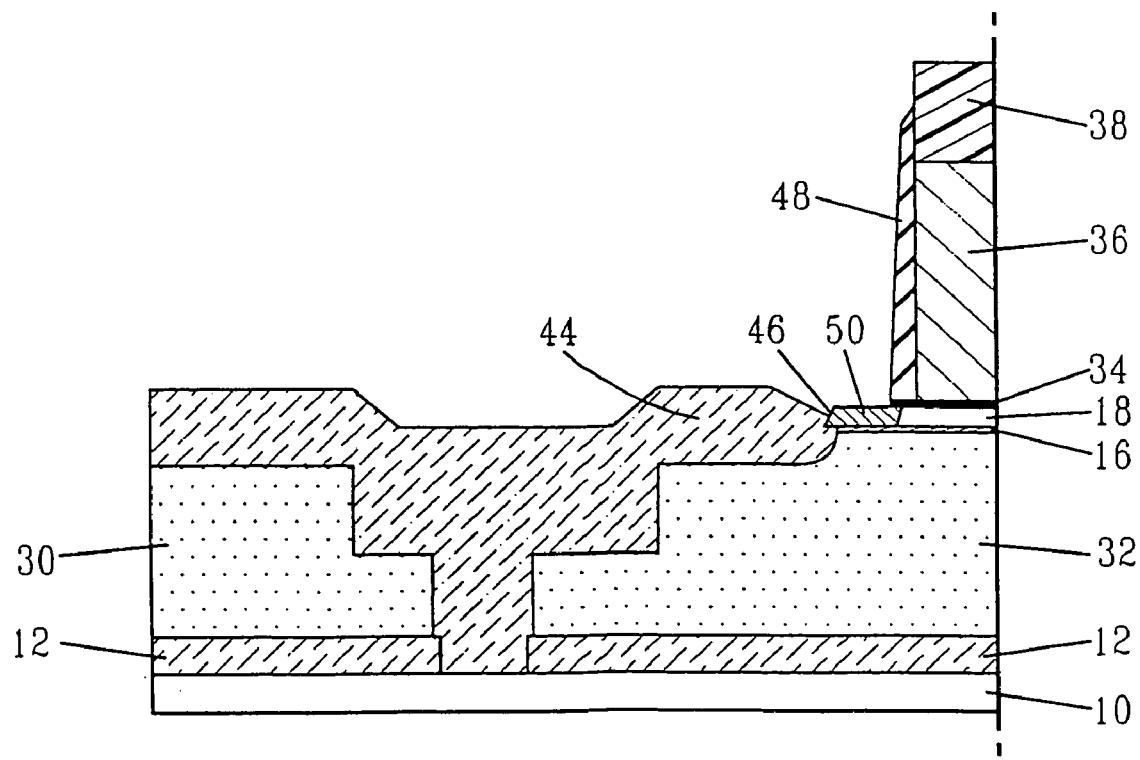

Source/drain extension implants are then performed into the exposed outer portion of the ledge 46 so as to provide source/drain extension implant regions 50 in the Si-containing layer 18. The exposed ledge 46 containing source/drain extension regions 50 serve as a seed region to grow a Si-containing layer thereon. The resultant structure that is formed after the above processing steps have been performed is illustrated in FIG. 2H.

Figure 2I:
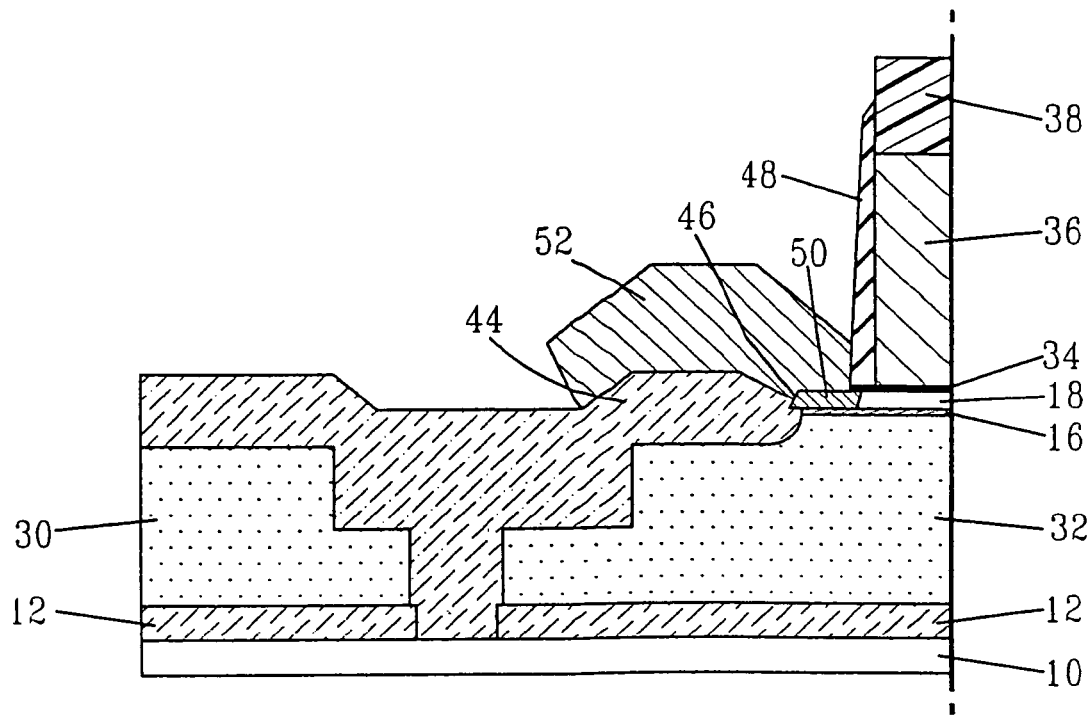

FIG. 2I illustrates the resultant structure that is formed after source/drain contact regions 52 are formed. The source/drain contact regions 52 are formed using a selective lateral epi overgrowth process. The source/drain contact regions 52 are formed atop the lateral ledges 46 of the Si-containing layer 18 containing the source/drain extension regions 50 as well as atop portions of the self-aligned isolation regions 44. The source/drain contacts 52 are in contact with at least the vertical edge of second spacers 48.

Figure 2J:
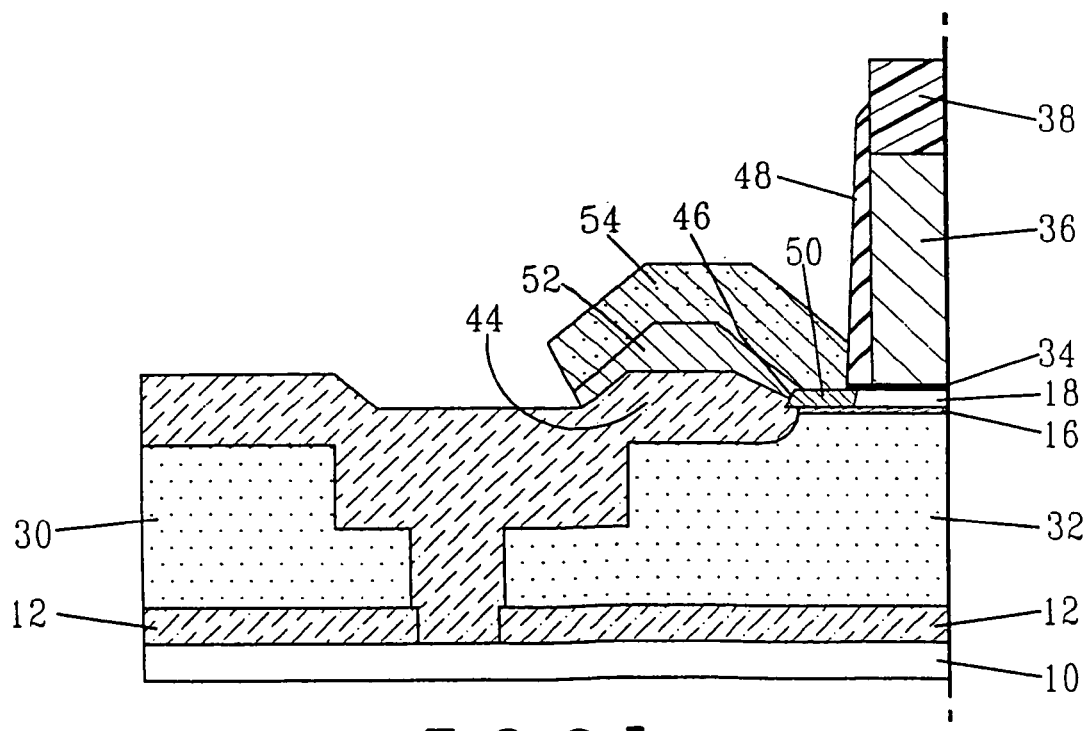

Following formation of the source/drain contacts 52, a resist mask (not shown) is formed atop portions of the structure which overlays the N-doped back-plane region 30, and the source/drain regions 54 are formed into the exposed regions of the source/drain contacts 52 utilizing a shallow ion implantation process. See FIG. 2J.

The shallow implantation process is required to ensure that the dopants are not implanted into any region that lies beneath the source/drain contacts 52. The above steps of resist blocking and ion implantation can be used in forming the implants for the PFET (not shown).

Figure 2K:
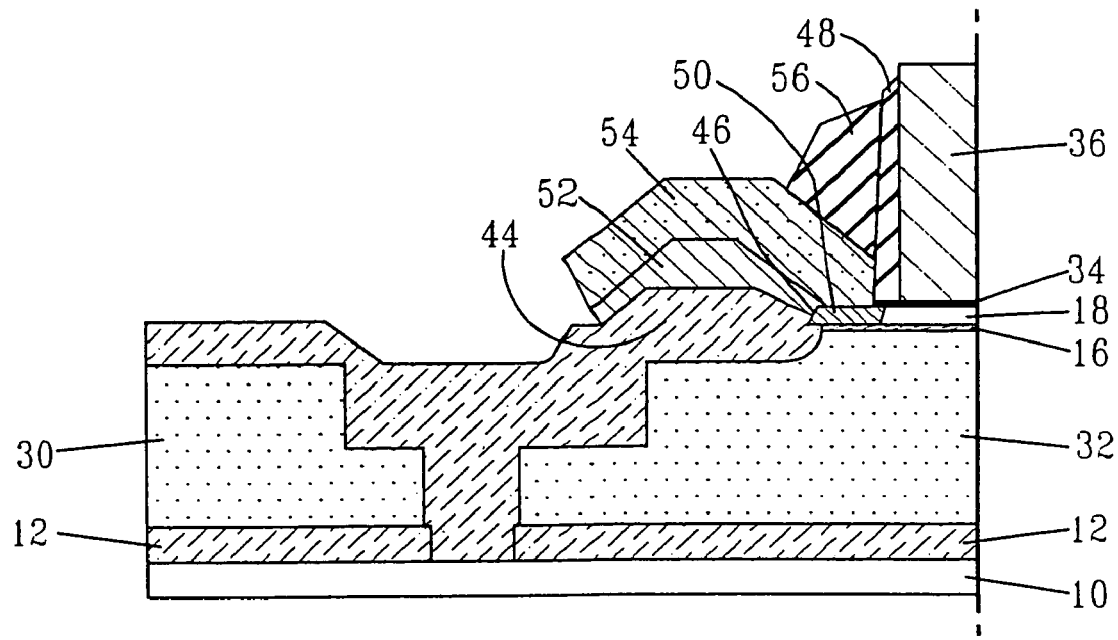

Spacers 56 (which are the third spacers employed in the present invention) are then formed atop the source/drain regions 54 utilizing conventional deposition and etching. Portions of spacers 56 are in contact with exposed vertical surfaces of second spacers 48. The mask 38 located atop the patterned gate electrode 36 is then removed providing the structure shown, for example, in FIG. 2K.

Figure 2L:
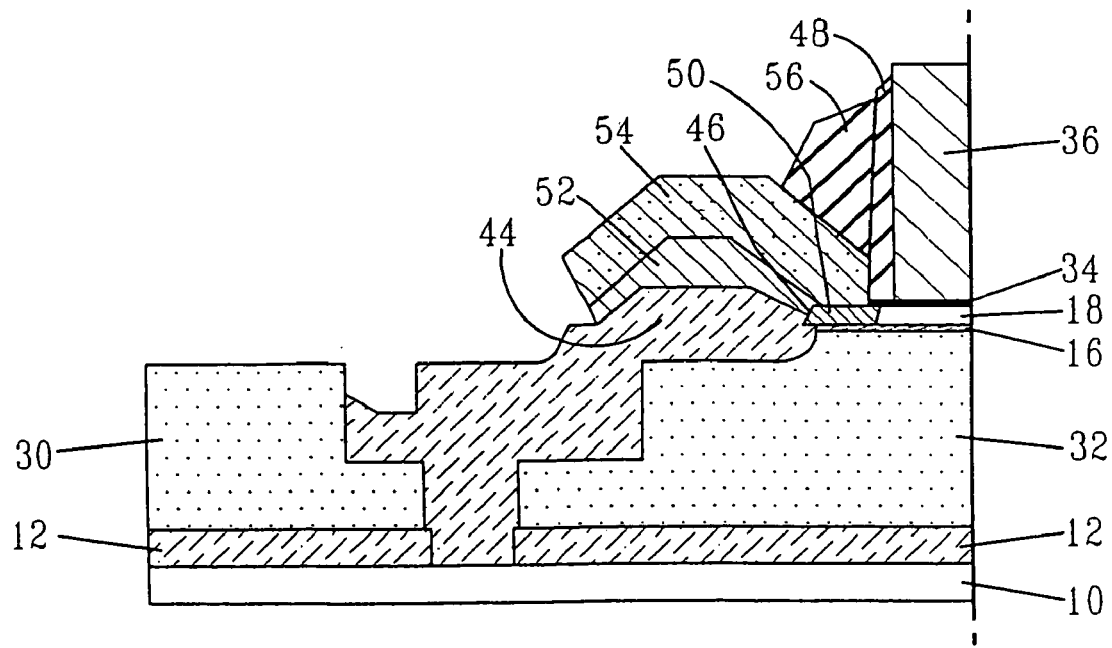

A resist mask (not shown) is then formed atop portions of the structure and the exposed portions of self-aligned isolation regions 44 formed atop the doped back-plane regions are removed utilizing a selective etching process such as RIE providing the structure shown, for example, in FIG. 2L. After the selective etching process has been performed, the resist mask mentioned above is stripped from the structure.

Figure 2M:
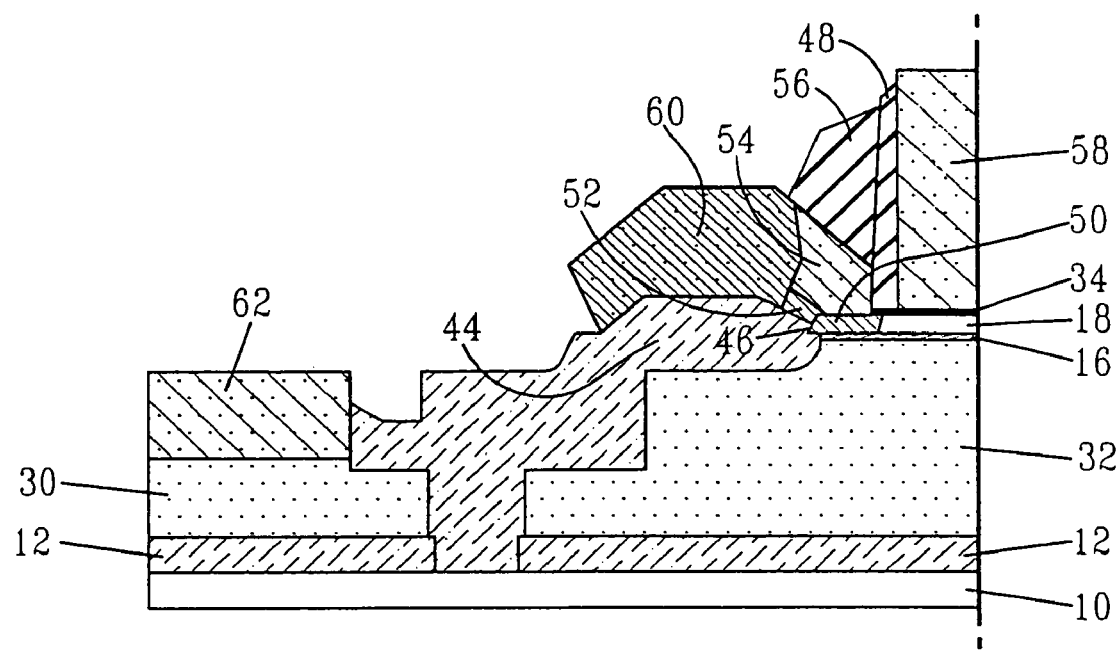
Figure 2N:
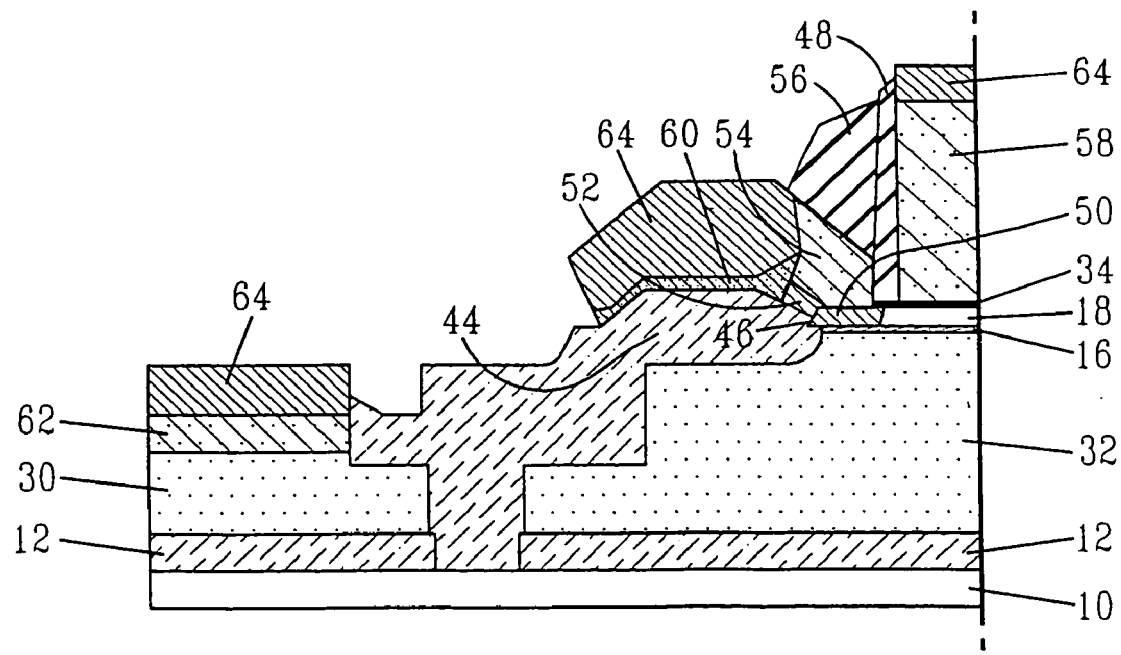

Another resist mask (not shown) is formed, and then deep implants of an N-type dopant are performed into portions of exposed the N-doped back-plane region 30, portions of exposed the source/drain contact region 52, and portions of the gate electrode 36. In FIG. 2M, reference numeral 58 denotes N-gate region, reference numeral 60 denotes N-source/drain regions, and reference numeral 62 denotes N-doped back-plane contact region. The resist is removed and the above steps are repeated in the P-FET region of the structure.

FIG. 2N shows the structure that is formed after siliciding exposed portions of regions 58, 60 and 62. The silicide regions denoted by reference numeral 64 are formed utilizing a conventional silicidation process which includes applying a refractory metal such as Ti or Co atop regions 58, 60 and 62, annealing the structure to cause formation of silicides 64 in areas containing refractory metal and removing any non-reacted refractory metal from the structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters PATENT is:

1. A method of forming a double-gate field effect transistor (DGFET) comprising:
   providing a structure which includes at least a doped back-plane region, a back-gate dielectric formed atop said doped back-plane region, a Si-containing layer formed atop said back-gate dielectric, a front gate dielectric formed atop said Si-containing layer, and a front gate formed atop said front gate dielectric, said structure having isolation trench regions adjacent to at least said doped back-plane region;
   forming first spacers having a first lateral width on exposed sidewalls of said front gate, said first spacers protecting portions of said underlying Si-containing layer from oxidation;
   forming isolation regions in regions of said structure which are adjacent to the back-gate dielectric and directly overlaying a portion of said doped back-plane region, whereby ledges are formed in said Si-containing layer under said first spacers;
   removing said first spacers and replacing the same with second spacers, said second spacers having a lateral width that is less than the first lateral width of said first spacers;
   selectively growing Si-containing regions above and in contact with said ledges, wherein said Si-containing regions are also above portions of the isolation regions; and
   forming source/drain regions in said Si-containing regions.

2. The method of claim 1 wherein said structure is provided using a bonding and thinning process.

3. The method of claim 1 wherein said isolation regions are self-aligned with said front gate and are formed by an oxidation process.

4. The method of claim 3 wherein prior to forming said self-aligned isolation regions oxygen ions or another suitable oxidation enhancer are implanted into the structure.

5. The method of claim 1 wherein said first spacers have a lateral thickness of from about 20 to about 200 nm.

6. The method of claim 1 wherein said second spacers have a lateral thickness of from about 10 to about 30 nm.

7. The method of claim 1 further comprising forming silicide regions on said source/drain regions and said front gate.

8. The method of claim 1 further comprising forming contact regions adjacent to said isolation regions.

9. The method of claim 1 wherein said selectively growing comprises an epitaxial silicon overgrowth process.

10. The method of claim 1 wherein said doped back-plane region is formed atop a bottom insulator, said bottom insulator is formed atop a handle wafer.

11. The method of claim 1 wherein said doped back-plane region is formed by ion implanting and annealing.

12. The method of claim 1 wherein said doped back-plane region comprises P-polysilicon and said front gate is an NFET or said doped back-plane region comprises N-polysilicon and said front gate is a PFET.

* * * * *